(12) United States Patent
Tinnemeyer

(10) Patent No.: US 6,778,913 B2
(45) Date of Patent: Aug. 17, 2004

(54) MULTIPLE MODEL SYSTEMS AND METHODS FOR TESTING ELECTROCHEMICAL SYSTEMS

(75) Inventor: Joern Tinnemeyer, Richmond (CA)

(73) Assignee: Cadex Electronics Inc., Richmond (CA)

(*) Notice: Subject to any disclaimer, the term of this patent is extended or adjusted under 35 U.S.C. 154(b) by 194 days.

(21) Appl. No.: 10/133,400

(22) Filed: Apr. 29, 2002

(65) Prior Publication Data

US 2003/0204328 A1 Oct. 30, 2003

(51) Int. Cl.[7] .............................................. G06F 19/00
(52) U.S. Cl. .................................... 702/30; 702/57
(58) Field of Search ......................... 324/426, 430; 702/30, 57, 60, 63, 64, 65

(56) References Cited

U.S. PATENT DOCUMENTS

| | | | | |
|---|---|---|---|---|
| 5,936,383 A | * | 8/1999 | Ng et al. ................... 320/132 |
| 6,011,379 A | * | 1/2000 | Singh et al. ................ 320/132 |
| 6,061,638 A | * | 5/2000 | Joyce .......................... 702/63 |
| 6,208,147 B1 | * | 3/2001 | Yoon et al. ................. 324/430 |
| 6,262,577 B1 | * | 7/2001 | Nakao et al. ............... 324/425 |
| 6,456,988 B1 | * | 9/2002 | Singh et al. .................. 706/2 |

* cited by examiner

*Primary Examiner*—John Barlow
(74) *Attorney, Agent, or Firm*—Oyen Wiggs Green & Mutala

(57) ABSTRACT

A method for testing an electrochemical system includes obtaining complex impedance data for the electrochemical system at multiple frequencies; fitting the complex impedance data to two or more models of the system to obtain a set of fitted parameters; and deriving a value for a characteristic of the electrochemical system based upon parameters of the set of fitted parameters. The electrochemical system may be an electrochemical battery. The characteristic may be a state of health, state of charge, or other characteristic of a battery.

45 Claims, 10 Drawing Sheets

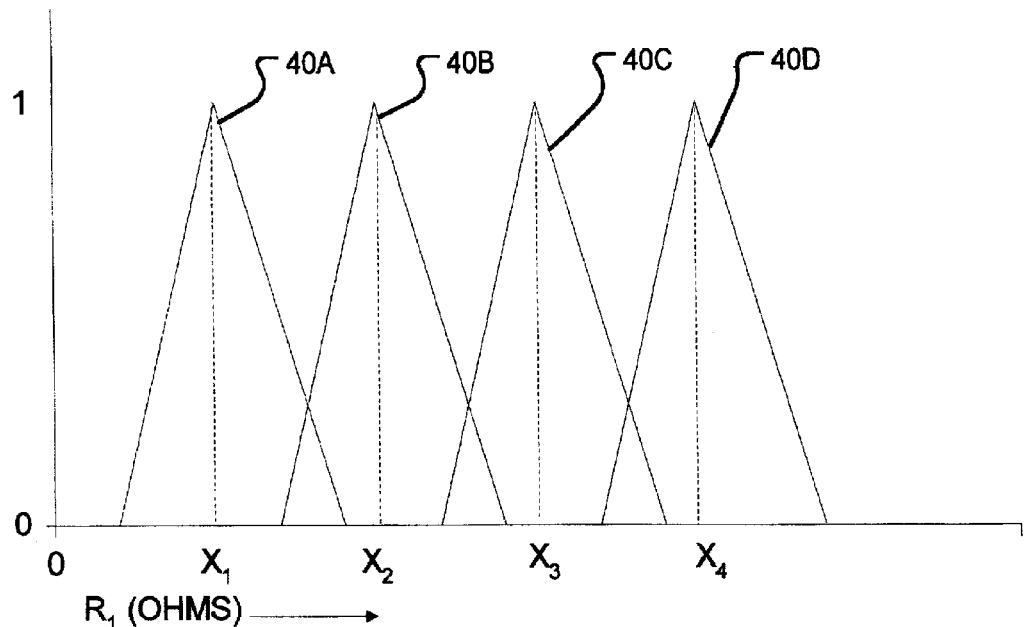
FIGURE 8
FIGURE 9
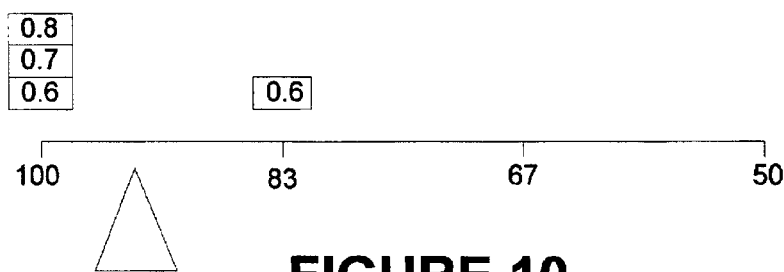
FIGURE 10

MULTIPLE MODEL SYSTEMS AND METHODS FOR TESTING ELECTROCHEMICAL SYSTEMS

TECHNICAL FIELD

The invention relates to systems and methods for testing electrochemical systems. The invention has application to testing electrochemical batteries, fuel cells and other electrochemical systems. The invention may be embodied, for example, in battery testers.

BACKGROUND

It can be necessary to test electrochemical systems to evaluate their condition. For example, electrochemical batteries used in critical applications need to be tested periodically to ensure that they will be able to function properly when needed. Testable characteristics of electrochemical batteries may include: state of health (SoH), state of charge (SoC), cold cranking amperes (CCA), cranking amperes (CA), marine cranking amperes (MCA), reserve capacity, capacity and others.

There exist various battery testing methods. Some of these methods are undesirably time consuming. Others require the battery being tested to be discharged, so that during testing the battery is not available for service. Other tests are undesirably inaccurate.

There is a need for new methods and apparatus for testing electrochemical systems, such as electrochemical batteries, which ameliorate at least some disadvantages of the prior art.

SUMMARY OF THE INVENTION

The invention relates to methods and apparatus for testing electrochemical systems.

One aspect of the invention provides methods for testing an electrochemical system. The methods comprise: obtaining complex impedance data for the electrochemical system at a plurality of frequencies; fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters. The models may include electronic equivalent circuit models.

The electrochemical system may comprise a battery, fuel cell, surface coating, electrolytic capacitor, or the like.

Another aspect of the invention provides a method for deriving a characteristic of an electrochemical system. The method comprises extracting impedance data from the electrochemical system at a plurality of discrete frequencies; mathematically fitting a plurality of models to the extracted impedance data to obtain a set of fitted parameters; and, inferring the characteristic based on one or more parameters selected from the set of fitted parameters.

A further aspect of the invention provides apparatus for testing electrochemical systems. The apparatus comprises: a measuring circuit connectable to measure responses of the electrochemical system to an excitation signal at a plurality of frequencies; and a data processor configured to: obtain complex impedance data for the electrochemical system from the measuring circuit; fit the complex impedance data to a plurality of models of the electrochemical system to obtain a set of fitted parameters, the set of fitted parameters comprising at least one fitted parameter corresponding to each of the models; and, derive a value for a characteristic of the electrochemical system based upon one or more parameters of the set of fitted parameters.

A further aspect of the invention provides apparatus for testing an electrochemical system. The apparatus comprises means for extracting impedance data from the electrochemical system at a plurality of discrete frequencies; means for mathematically fitting a plurality of models to the extracted impedance data to obtain a set of fitted parameters; and, means for inferring a characteristic of the electrochemical system based on one or more parameters selected from the set of fitted parameters.

Another aspect of the invention provides a machine readable medium carrying data. The data comprises a set of instructions which, when executed by a data processor, cause the data processor to perform a method of testing an electrochemical system. The method comprises: obtaining impedance data for the electrochemical system at a plurality of frequencies; fitting the impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set fitted parameters.

Further aspects of the invention and features of specific embodiments of the invention are described below.

BRIEF DESCRIPTION OF THE DRAWINGS

In drawings which illustrate non-limiting embodiments of the invention,

FIG. 8 shows an example set of normalization functions;

FIG. 9 shows an example matrix containing results of normalization functions for a plurality of parameters from a plurality of models; and, FIG. 10 illustrates one way to aggregate the results of the matrix of FIG. 9.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention relates to the measurement of characteristics of electrochemical systems. The following description describes applications of the invention to the determination of characteristics of electrochemical batteries (such as, for example, nickel metal hydride (NiMH), lead-acid, nickel cadmium (NiCd) or lithium ion batteries). The invention may be applied, inter alia, to evaluating the state of health (SoH) or state of charge (SoC) of such batteries. The invention may also be applied to the measurement of characteristics of other electrochemical systems, such as: fuel cells, layers of coatings (e.g. paints or anodized layers on metallic surfaces), electrolytic capacitors and the like.

The methods of the invention involve determining the complex electrical impedance (or obtaining data equivalent to the complex electrical impedance) of an electrochemical system being studied at multiple frequencies, fitting the resulting data to a plurality of electrochemical models of the system, and obtaining a value for a characteristic quantity of interest based upon best fitting parameters of the plurality of electrochemical models.

Figure 1:
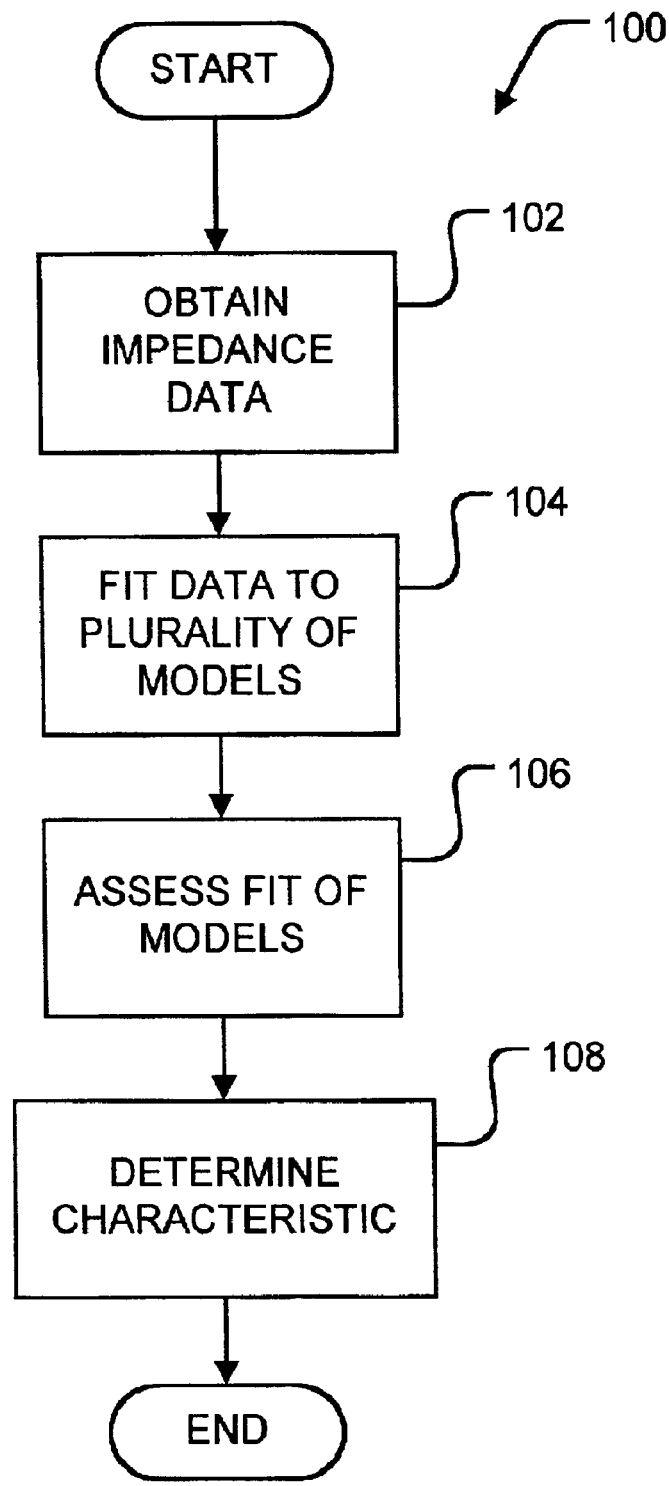
FIG. 1 is a flow chart illustrating a method according to the invention.

FIG. 1 shows a method 100 for testing a battery according to one embodiment of the invention. In block 102, complex impedance data is obtained at a plurality of excitation frequencies. For each excitation frequency, the impedance data may comprise a complex impedance Z having a real component R and an imaginary component S. The term- "complex impedance data" includes data directly representing the real and imaginary components of the complex impedance as well as equivalent data from which the complex impedance can be mathematically derived. For example, the complex impedance of a battery may be derived from data representing the phase and magnitude of a current signal relative to that of a voltage signal.

In block 104, the complex impedance data obtained for the battery is fit to each of a plurality of different electrochemical models for the battery. Each of the electrochemical models may be based upon a different equivalent electronic circuit, which has its own frequency dependent impedance. For each model, the fitting may involve determining values for one or more variable parameters of the electrochemical model which cause the electrochemical model to predict impedance values which most closely match the impedance data obtained in block 102 for each excitation frequency.

Block 106 (which is not required in all embodiments of the invention) involves making an assessment of how well each of the plurality of electrochemical models fitted in block 104 fits the impedance data obtained for the battery in block 102. In block 108, a value for a characteristic of the electrochemical system is obtained based upon the parameters of one or more models (fitted in block 104) and the assessment of the fit for the different models (if determined in block 106).

Figure 2:
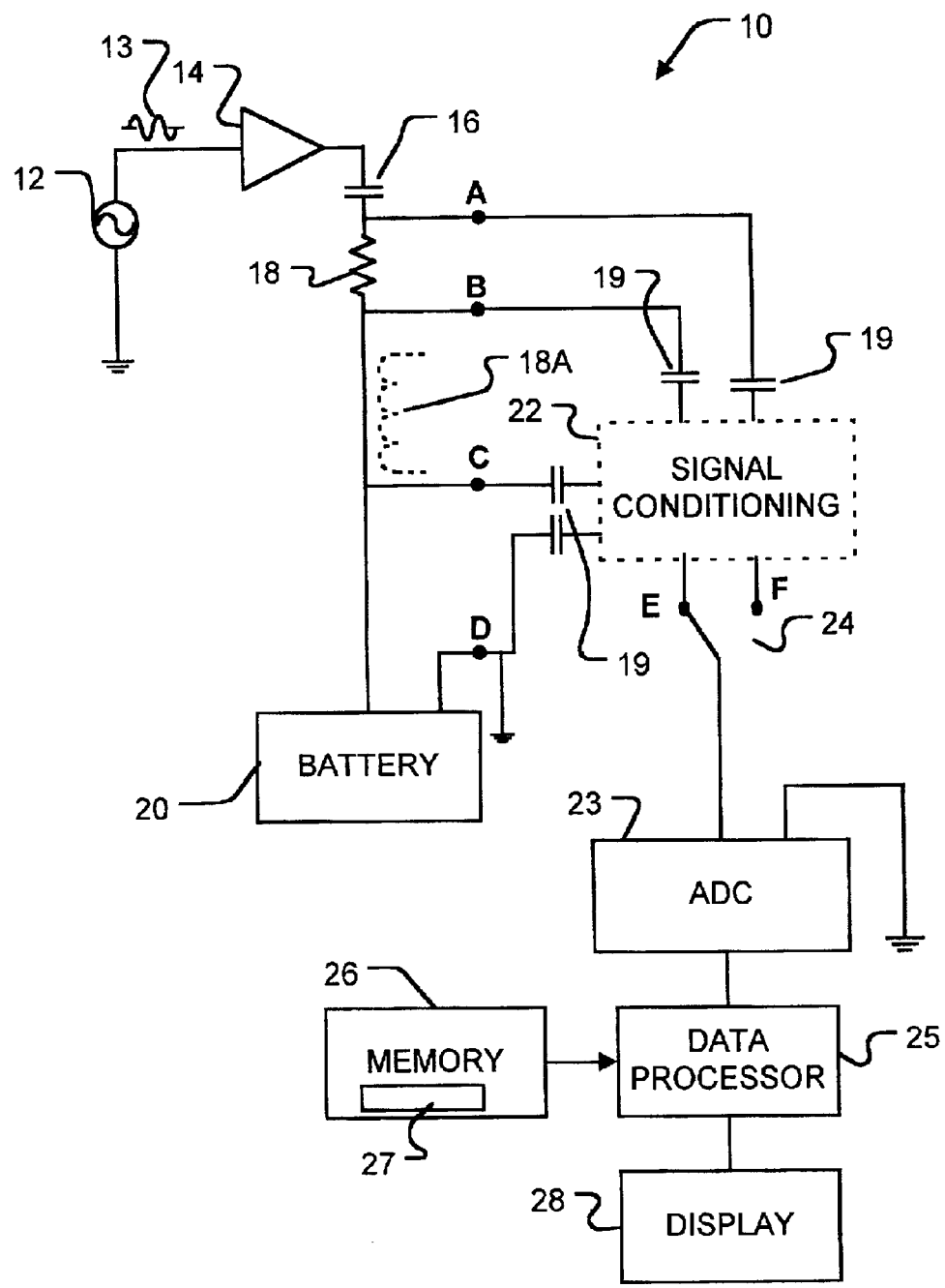
FIG. 2 is a schematic diagram of a battery testing apparatus according to one embodiment of the invention.

FIG. 2 is a schematic diagram illustrating major components in a battery tester 10 according to one embodiment of the invention. Battery tester 10 comprises a signal generator 12, which generates an excitation signal 13. Excitation signal 13 is amplified by an amplifier 14 and coupled to a battery 20. In the illustrated embodiment, excitation signal 13 is coupled to battery 20 by way of a coupling capacitor 16 and a current shunt 18. Coupling capacitor 16 may comprise a number of capacitors connected in series and/or parallel and preferably has a significant capacitance. For example, coupling capacitor 16 may have a capacitance on the order of 5000 $\mu$F in a case where the lowest frequency of interest is about 10 Hz. Excitation signal 13 may comprise a sine wave having a desired frequency or a waveform having a plurality of frequency components.

Tester 10 measures a voltage imposed by excitation signal 13 between the terminals of battery 20 and also measures electrical current passing into battery 20. In the illustrated embodiment, voltage is measured between test points C and D and digitized by an analog to digital converter ("ADC") 23. ADC 23 may be, for example, a 12-bit ADC. Coupling capacitors 19 may be included in the circuit between tests points C and D and ADC 23 to block DC signal components. One or more suitable signal conditioning stages 22 may also be provided prior to ADC 23. Signal conditioning stages 22 may comprise a difference amplifier 22A. Current is measured by measuring a voltage across current shunt 18 (i.e. the voltage between test points A and B). Current shunt 18 may comprise a resistor with a resistance of, for example, ½ $\Omega$. Such a low resistance current shunt 18 helps to minimize the impact of apparatus 10 on the measurement results. Coupling capacitors 19 and signal conditioning stage 22 may also be provided between test points A and B and ADC 23.

In the illustrated embodiment, an electronic switch 24 permits an input of ADC 23 to be selectively connected to receive either a signal from test point E, which represents voltage across battery 20, or a signal from test point F, which represents a current passing into battery 20.

Figure 3:
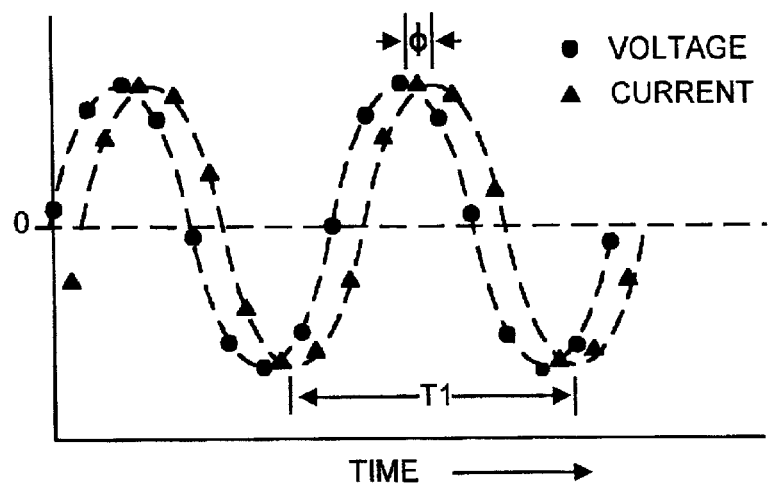
FIG. 3 is a plot illustrating measurements of voltage and current for an example battery under test.

Data sufficient to determine an impedance Z at a frequency of interest may be obtained by sampling each of the voltage and current signals at a sufficient rate. Voltage and current may be sampled in alternation with one another by switching switch 24. For example, FIG. 3 shows a plot of current and voltage samples taken over time for a case where signal generator 12 excites battery 20 with a sine wave excitation signal 13 having a period T1. It can be seen from the sampled current and voltage data points, that the current leads the voltage by a phase difference $\Phi$.

Data from ADC 23 is provided to a data processor 25, which can access a memory 26. Data processor 25 executes instructions of a software program 27. In the illustrated embodiment, memory 26 is separate from data processor 25. In general, however, memory 26 may be incorporated in data processor 25. Data processor 25 may comprise more than one processor. For example, data processor 25 may comprise a microprocessor and a digital signal processor. Under the control of program 27, data processor 25 applies a method of the invention to determine a characteristic of battery 20. Once the characteristic of battery 20 is determined, data processor 25 may cause a value of the characteristic to be displayed on a display 28. Although not shown explicitly in FIG. 2, data processor 25 is connected to control the frequency of excitation signal 13 and the gain of amplifier 14.

Figure 4:
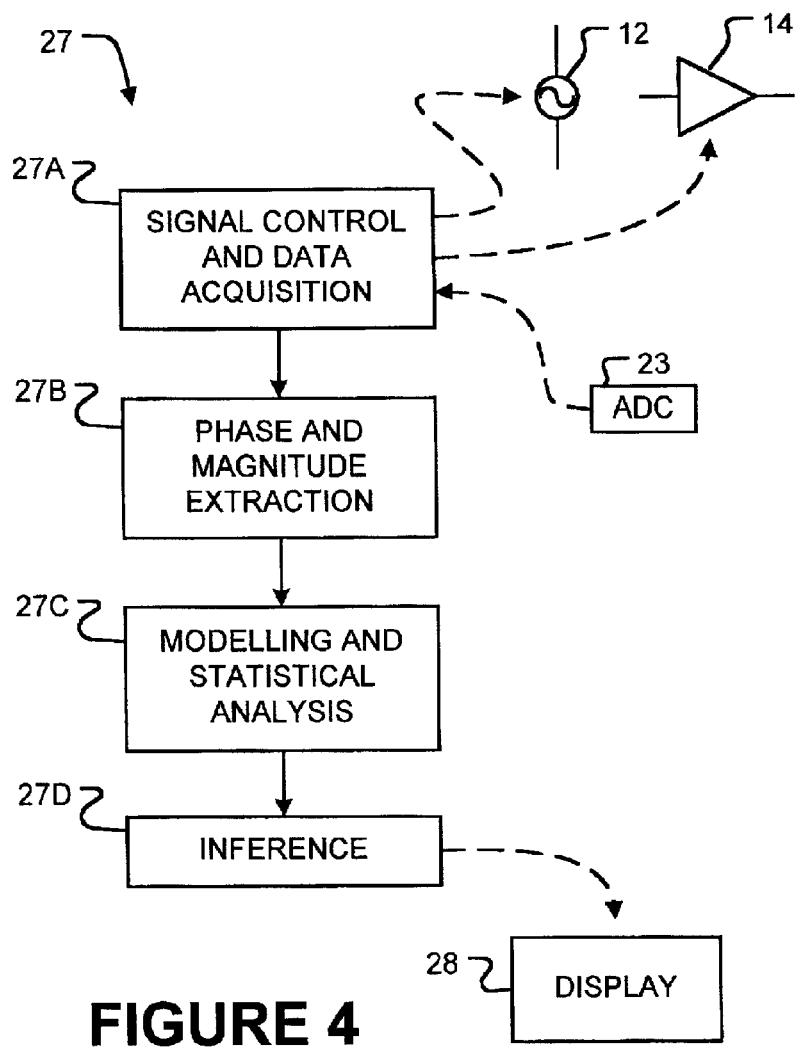
FIG. 4 is a diagram illustrating a flow of information in an apparatus according to one embodiment of the invention.

FIG. 4 illustrates one way in which the functions of software 27 may be broken down conceptually. Software 27 includes a signal control and data acquisition portion 27A, a phase and magnitude extraction portion 27B, a modelling and statistical analysis portion 27C and an inference portion 27D. The flow of information is generally from portion 27A toward portion 27D.

Figure 5A:
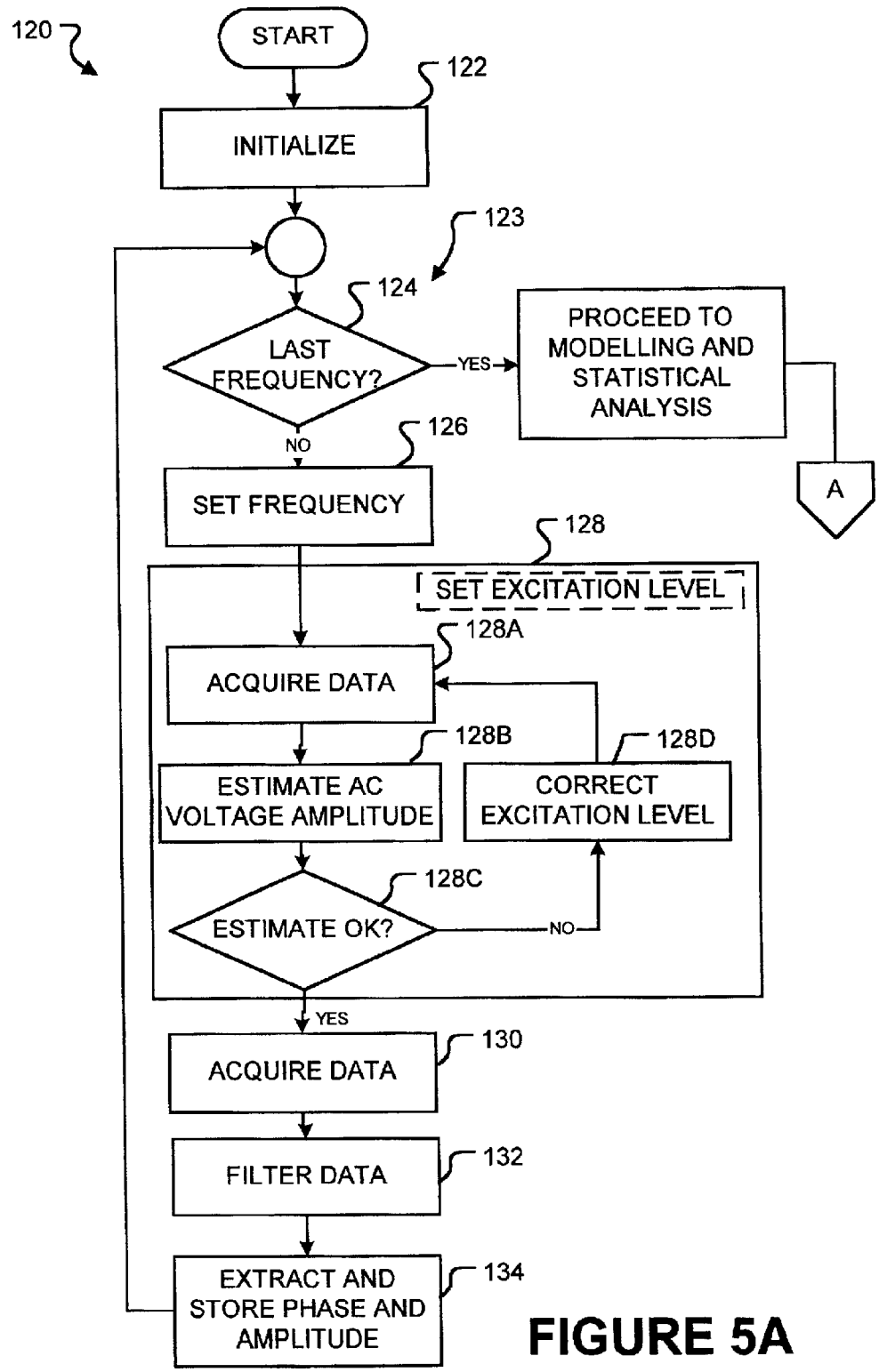
FIGS. 5A, 5B and 5C are flow charts illustrating first, second and third aspects respectively of a method according to one embodiment of the invention.
Figure 5B:
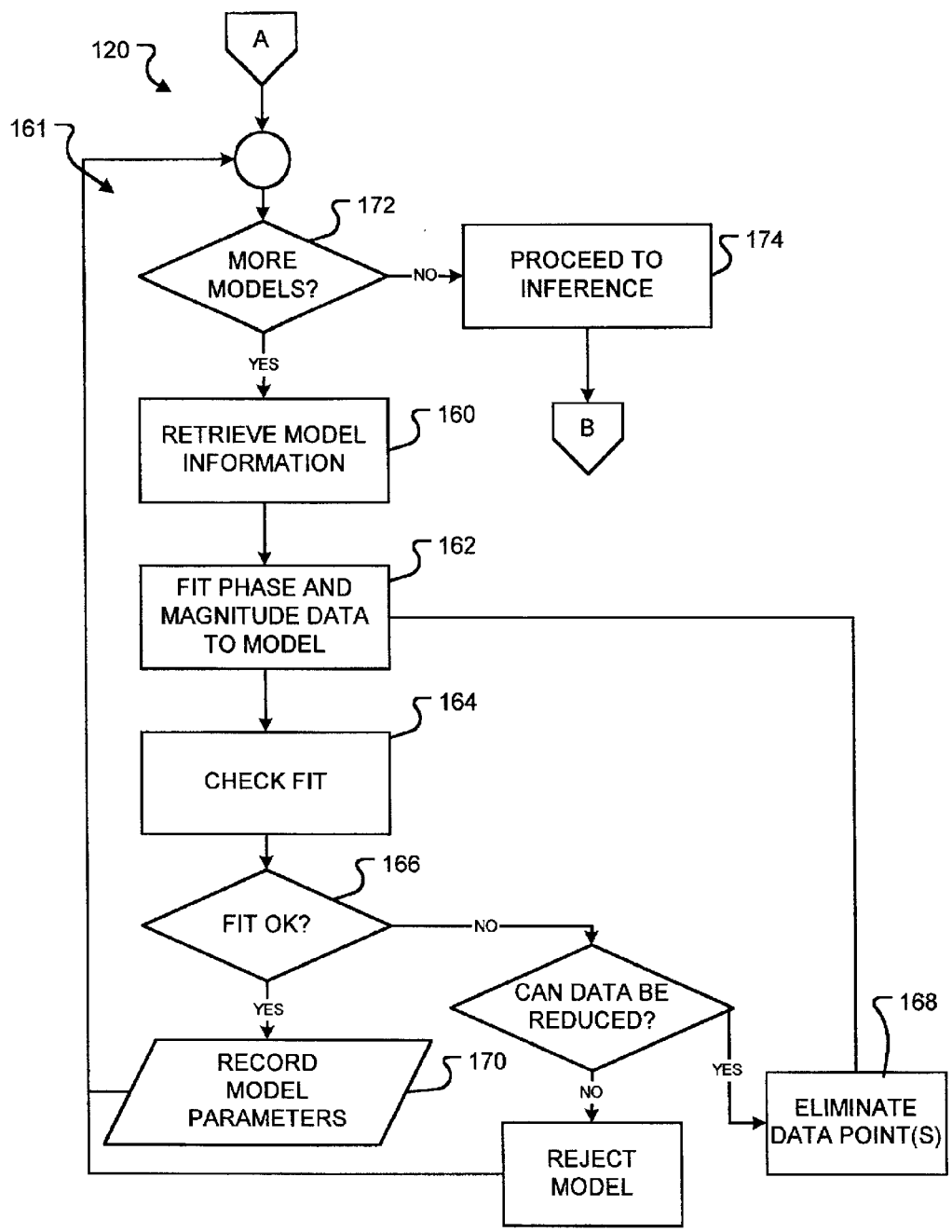
Figure 5C:
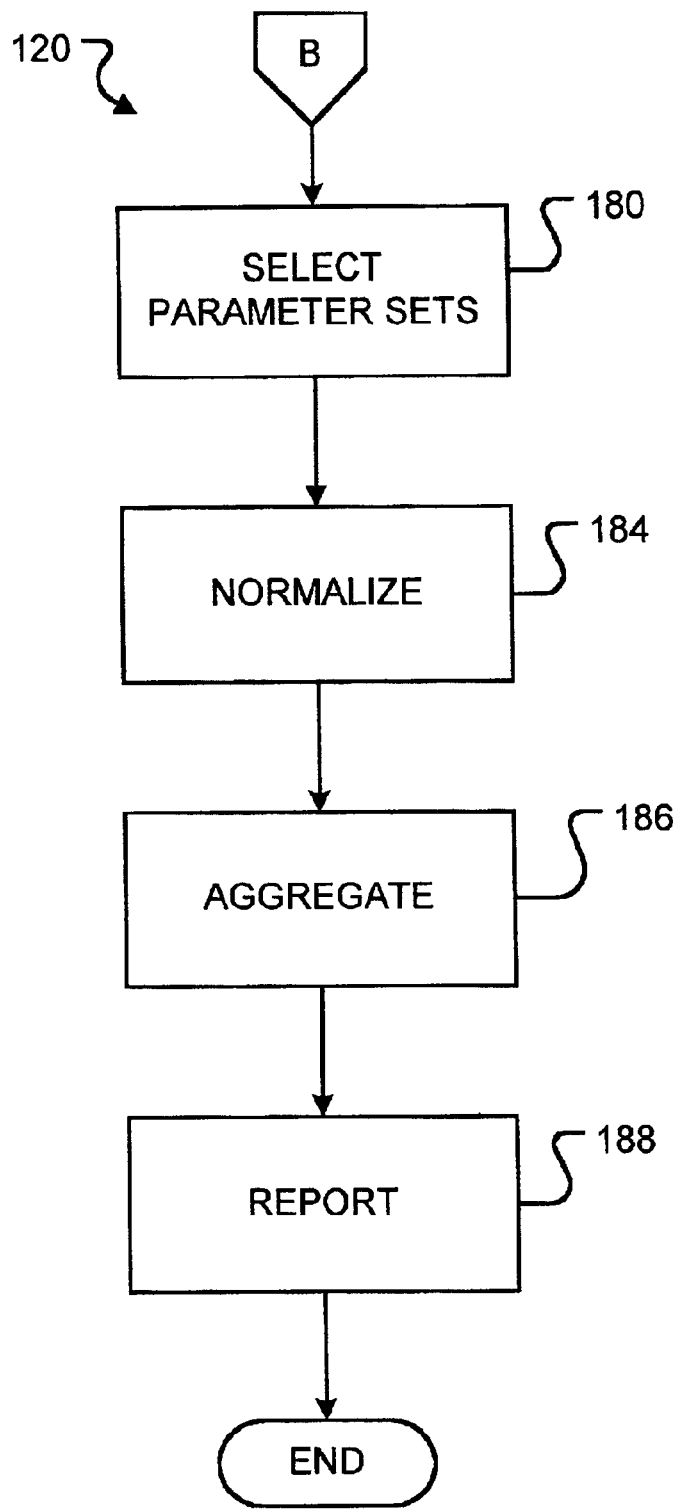
Figure 6:
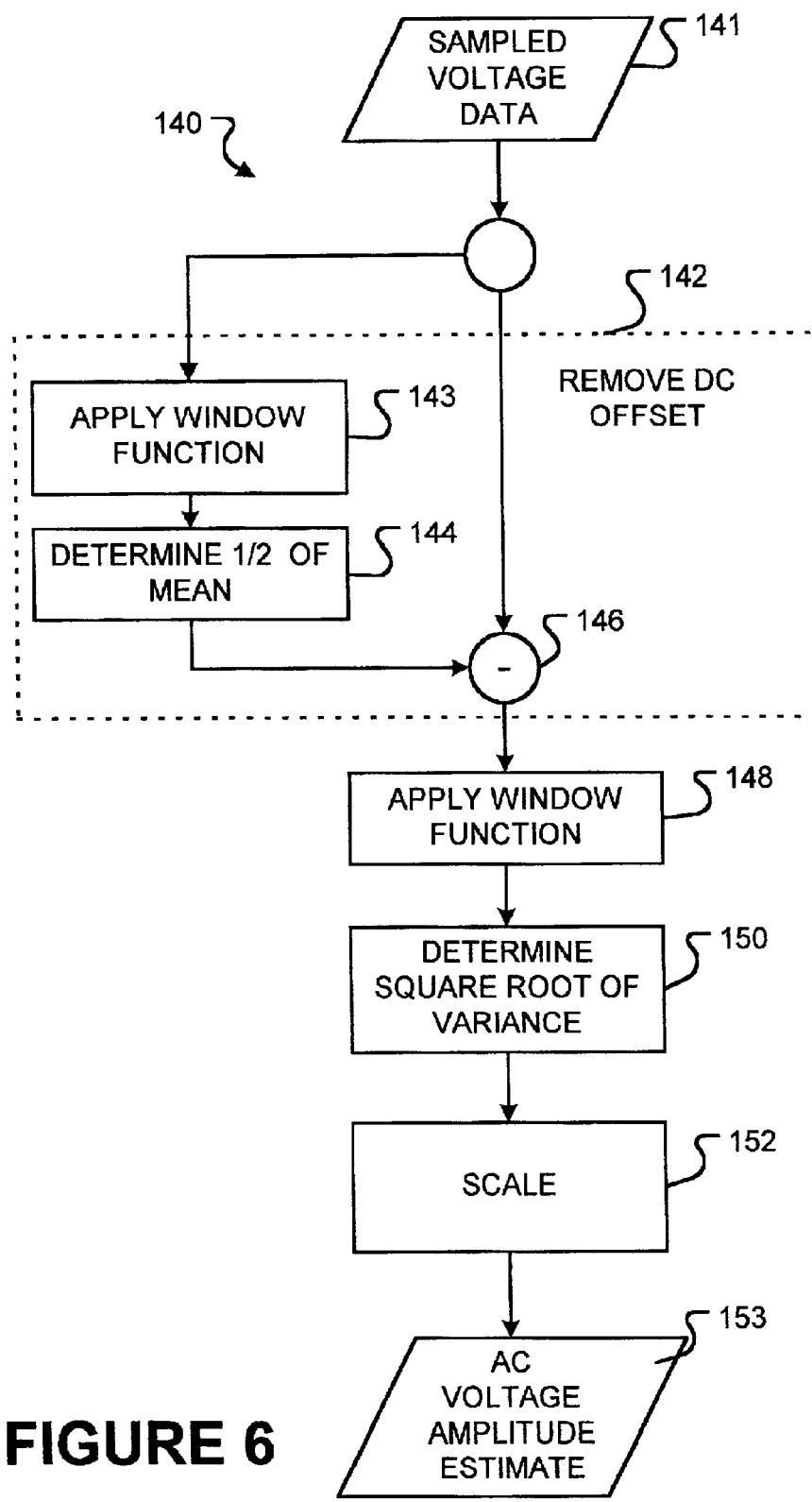
FIG. 6 is a flow chart illustrating a way to estimate an amplitude of an excitation signal.

FIGS. 5A through 6 illustrate a method 120 for determining a characteristic of battery 20 according to one embodiment of the invention. Method 120 may be performed by data processor 25 while executing software instructions 27. In the following description of method 120, reference is made to SoH as the battery characteristic of interest, with the understanding that other battery characteristics may be similarly derived. In the method depicted in these figures, excitation signal 13 is a sine wave.

Method 120 bases its determination of the SoH of battery 20 on complex impedance data for battery 20 at a plurality of excitation frequencies. In the illustrated embodiment the complex impedance data comprises relative phases and amplitudes of a current signal and excitation signal 13. The number N of excitation frequencies used during method 120 is selected to be at least sufficient to provide enough data to fit all of the electrochemical models used (see block 104 of FIG. 1). For example, in methods according to certain specific embodiments of the invention the number N of excitation frequencies may be in the range of 5 to 65.

The lowest of the N excitation frequencies used during method 120 may be selected to permit collection of data within a desired time. For example, the lowest of the N excitation frequencies may be 10 Hz or more. Lower excitation frequencies may also be used. For certain battery characteristics, such as SoH or CCA, higher excitation frequencies tend to be more important. When such battery characteristics are being measured, the lowest of the N excitation frequencies may be chosen to be relatively high in comparison to the lowest excitation frequencies which may be used in the measurement of other battery characteristics. The highest excitation frequency which can be used in method 120 may be limited by the speed at which ADC 23 can acquire data. The invention may typically be practiced using excitation frequencies that are less than about 2000 to 2500 Hz. In an example embodiment of the invention, data sufficient to determine an impedance Z of battery 20 is acquired at 22 excitation frequencies in the range of 10 Hz to 2000 Hz.

Method 120 begins with initialization in block 122. Initialization includes identifying a first excitation frequency to which signal generator 12 will be set. Method 120 then enters loop 123 in which data is acquired for each of the N excitation frequencies. Loop 123 terminates when it is determined, in block 124, that data for a last excitation frequency has been obtained. Because data is collected for N excitation frequencies, loop 123 is executed N times. In block 126, software 27 causes processor 25 to set signal generator 12 to one of the N excitation frequencies for which it is desired to acquire impedance data.

Block 128 sets the gain of amplifier 14 to provide a desired excitation level. In block 128A of the illustrated embodiment, excitation signal 13 is applied to battery 20 and voltage data is acquired by ADC 23. The voltage data is collected at a sufficient rate (typically in excess of 4 times the frequency of excitation signal 13) and for a sufficient time (typically one or more periods of excitation signal 13) to obtain an estimate of the amplitude of excitation signal 13. For example, the voltage of excitation signal 13 may be sampled at 32 times its frequency and for a time equal to 8 of its periods.

In block 128B, the amplitude of excitation signal 13 at battery 20 is estimated from the sampled voltage data. This amplitude may be determined in various ways. FIG. 6 shows one possible noise resistant method 140 for using sampled voltage data 141 to determine an amplitude estimate 153 of the excitation signal 13. Amplitude determination method 140 involves removing DC offset from the sampled voltage data 141 in block 142. Block 143 applies a windowing function to sampled voltage data 141. In block 144, a mean value of the result is determined in block 144 of the windowing function is determined. In block 146, the result of block 144 is subtracted from sampled voltage data 141.

The window function used in block 143 could, for example, comprise a Hanning window function given by the equation:

$$H_i = 0.5 x_i \left[ 1 - \cos\left(\frac{2\pi i}{N}\right) \right] \qquad (1)$$

where $x_i$ is the $i^{th}$ data value and $H_i$ is an adjusted data value. Other windowing functions may also be used. For example, the Hamming or Kaiser window functions could also be used. Descriptions of these windowing functions may be found in *Signal Processing Toolbox for use with MATLAB—User's Guide version 5* 2001, The Mathworks Inc. Natick, Mass. which is hereby incorporated herein by reference.

The result of block 142 is sampled voltage data from which substantially all DC offset is removed. Such DC offset may have been present in the sampled voltage data 141 measured by ADC 23 or may have been introduced into sampled voltage data 141 by the operation of ADC 23.

In block 148, a windowing function (which could be the same function used in block 142) is applied to the resulting data and then, in block 150, a square root of the variance of the resulting data is determined. This result may be scaled in block 152 to produce an AC voltage amplitude estimate 153. The variance of the signal output by block 148 could be used directly as an AC voltage amplitude estimate in block 128. AC voltage amplitude estimate 153 is the result of the AC voltage estimation block 128B (see FIG. 5A).

The estimated AC voltage amplitude determined in block 128B is verified in block 128C. Block 128C may comprise, for example, comparing the estimated AC voltage amplitude to one or more thresholds. It is generally desirable that the amplitude of the excitation of battery 20 be maintained lower than a threshold. Block 128C may involve a comparison, for example, between the estimated AC voltage amplitude and a threshold amplitude at which non-linear effects become significant. Excitation signal 13 may be rejected in block 128C if the estimated AC amplitude exceeds the threshold amplitude. The threshold amplitude may be, for example, 10 mV per cell of battery 20. Block 128C may also check that the estimated AC voltage amplitude of signal 13 is greater than a lower threshold. The lower threshold may be, for example, in the range of 1 mV to 5 mV per cell of battery 20. If it is determined in block 128C that the amplitude of excitation signal 13 is acceptable, then processing continues in block 130. Otherwise, the process loops back to block 128A via block 128D. In block 128D, a correction is applied to the amplitude of excitation signal 13 by adjusting the gain of amplifier 14.

In block 128D, processor 25 may, for example, perform a proportional integral derivative (PID) based control routine to calculate a corrected gain for amplifier 14 is corrected. The PID routine may, for example, implement a calculation such as:

$$V_{new} = Pe_n + PI\Delta t \sum_{j=1}^{n} e_j + PD\frac{\Delta e_n}{\Delta t} \qquad (2)$$

where $V_{new}$ is a new gain of amplifier 14, P is a controller gain parameter, $e_n$ is the present error sample (i.e. a difference between a desired amplitude of excitation signal 13 and the amplitude determined in block 128B), $\Delta t$ is the sample time, I is an integral action rate parameter, D is a derivative action rate parameter, and $\Delta e_n$ is a change in the error sample since a previous iteration of block 128D.

Signal generator 12 and amplifier 14 may comprise their own control systems operative to maintain excitation signal 13 at an acceptable amplitude. If so, it may be unnecessary for method 120 to include block 128 for setting the excitation level.

In block 130, voltage and current data is acquired by ADC 23. At each of the N excitation frequencies, ADC 23 acquires sufficient data to determine the impedance Z of battery 20 at that excitation frequency. Preferably data is acquired for at least 5 periods of excitation signal 13. In block 130 ADC 23 may obtain a fixed number of voltage and current samples (which may be the same for each excitation frequency or different for different excitation frequencies). In some implementations of the invention a fixed number, for example, 512 samples of voltage and current are obtained for each excitation frequency. The sampling rate may be the same for each excitation frequency or different for different excitation frequencies. The sampling rate should be sufficiently high (i.e. preferably, at or above the Nyquist rate) to avoid aliasing.

In block 132, processor 25 causes a signal filtering operation to be performed. The signal filtering operation may comprise, for example, performing a discrete Fourier transform (DFT), which may be a fast Fourier transform (FFT), on the voltage and current data acquired in block 130. A FFT is typically computationally simpler to perform than other types of DFT. Where a FFT is performed, the number of data points to be filtered (i.e. voltage or current samples) should be a power of two. The operations of block 132 may be performed by a digital signal processor (DSP), a general-purpose processor, or in specialized hardware circuits incorporated in data processor 25. The operations of block 132 are performed for both the sampled current data and the sampled voltage data.

Block 132 optionally involves applying a window function to the sampled voltage and current data acquired in block 130. The window function may be applied, in the course of, or before, filtering the data. The window function could, for example, comprise a Hanning window function as shown in Equation (2). Other windowing functions may also be used. For example, the Hamming or Kaiser window functions could also be used.

A FFT may be performed efficiently by the methods described in Smith, *The Scientist and Engineers Guide to Digital Signal Processing*, California Technical Publishing, 1997 ISBN 0-9660176-3-3 or C. McGillem et al., *Continuous and Discrete Signal and System Analysis* ($2^{nd}$ ed.), Holt, Rinehart and Winston, 1984 ISBN: 0030617030, both of which are hereby incorporated by reference.

For each of the sampled current data and the sampled voltage data, the FFT computation produces two corresponding data arrays. The first data array contains data elements that represent real components (RE) of the FFT and the second data array contains data elements that represent imaginary components (IM) of the FFT.

Using the real (RE) and imaginary (IM) data arrays, the phase and magnitude of the voltage and current signals at the frequency of interest are extracted in block 134. The magnitude component of the $i^{th}$ data element of the FFT may be determined as follows:

$$Magnitude_i = \sqrt{(RE_i)^2 + (IM_i)^2} \quad (3)$$

Similarly, the phase of the signal having a frequency corresponding to the $i^{th}$ data element of the FFT may be determined as follows:

$$Phase_i = \tan^{-1}\left[\frac{(IM_i)}{(RE_i)}\right] \quad (4)$$

The phase difference $\Phi$ (see FIG. 3) between the signal represented in the current data and the signal represented in the voltage data may be determined by subtraction. Where a single ADC 23 is used to digitize both voltage and current signals then the phase difference $\Phi$ may be corrected for the phase lag that occurs because the current and voltage waveforms are sampled at different times, typically on the order of a few microseconds apart.

Because excitation signal 13 is applied to battery 20 at a particular excitation frequency and the FFT arrays, RE and IM, represent transformations of the sampled current and voltage data into the frequency domain, the FFT data elements with the maximum magnitude (see equation (3)) will be the ones corresponding to the excitation frequency of signal 13. For each of the sampled current data and the sampled voltage data, this maximum magnitude data element is extracted from the FFT arrays along with its corresponding phase.

Knowing the phase difference $\Phi$ between the current and voltage waveforms and the magnitudes of the current and voltage waveforms is mathematically equivalent to knowing the complex impedance Z of battery 20 at the frequency of interest. In this example, block 134 determines the complex impedance Z at the excitation frequency using the maximum magnitude data element extracted from the FFT of the sampled voltage data, the maximum magnitude data element extracted from the FFT of the sampled current data and their corresponding phases. In block 134 of this example, the complex impedance Z at the excitation frequency is calculated and saved. One method of calculating the complex impedance Z at the excitation frequency is:

$$Z = \frac{V}{I} e^{2\pi j \phi} \quad (5)$$

where V and I are respectively the magnitudes of the voltage and current waveforms as calculated by equation (3) and $\Phi$ is the phase difference between their corresponding phase data elements. The complex impedance data is extracted and stored for each of the N excitation frequencies.

Block 134 may also comprise verifying that the maximum magnitude data element extracted from the FFT of the sampled voltage data and the maximum magnitude data element extracted from the FFT of the sampled current data occur at the same location in the frequency domain. If the maximum magnitude data element corresponding to the sampled voltage data is the $k^{th}$ data element of the FFT, then the maximum magnitude data element corresponding to the sampled current data should also be the $k^{th}$ element, because these $k^{th}$ elements correspond to the excitation frequency. An error may be signalled in block 134 and/or data acquisition may be repeated if this verification process does not succeed.

In the illustrated embodiment, memory is conserved by extracting and storing the complex impedance data for each excitation frequency before sampling voltage and current data for the next excitation frequency. In this manner, the same set of memory locations may be used to store the sampled voltage and current data acquired in each iteration of block 130. In situations where more memory is available, sampled voltage and current data could be acquired for a plurality of excitation frequencies, or for all N excitation frequencies, before extracting impedance data for each excitation frequency.

When it is determined in block 124 that impedance data has been obtained for all N excitation frequencies, then method 120 terminates loop 123 and proceeds to perform modeling and statistical analysis on the results. FIG. 5B shows a continuation of method 120 starting at point A.

FIG. 5B depicts a model fitting portion of method 120, which comprises a loop 161. In each iteration of loop 161, an electrochemical model is fitted to the extracted impedance data for the N excitation frequencies. Fitting a particular electrochemical model involves finding values for a number of parameters of the model which cause the model to best fit to the extracted impedance data over the N excitation frequencies. The number of fitted models may vary for each application. Loop 161 is exited when it is determined in step 172 that there are no more models to fit.

In block 160, processor 25 retrieves information specifying an electrochemical model to be applied to battery 20. The model information may be retrieved from a library, which may comprise functions stored in memory 26. The functions stored in memory 26 may comprise software routines which compute the real and imaginary components of the impedance Z predicted by an electrochemical model has a function of frequency and one or more variable model parameters.

Each electrochemical model comprises a number of variable parameters. The model may mathematically express the behavior of an electronic circuit, which could be representative of the electrochemical system being tested (in this case, battery 20). Such models are said to be equivalent electronic circuit models. The equivalent electronic circuit model may comprise elements such as resistors, inductors, capacitors, constant phase elements, and Warburg impedance elements.

Table I summarizes the impedances of a number of circuit elements which could be incorporated into equivalent electronic circuit models for electrochemical systems.

TABLE I

EQUIVALENT ELECTRONIC CIRCUIT COMPONENTS

| ELEMENT | IMPEDANCE |
|---|---|
| Resistor (R) | $R$ |
| Capacitor (C) | $\dfrac{1}{j\omega C}$ |
| Inductor (L) | $j\omega L$ |
| Warburg Impedance (infinite thickness) (W) | $\sigma\sqrt{\omega}\,(1-j)$ |
| Warburg Impedance (finite thickness) (W) | $\sigma\sqrt{\omega}\,(1-j)\tanh\left[\delta\left(\dfrac{j\omega}{D}\right)^{\frac{1}{2}}\right]$ |
| Q (CPE) | $\dfrac{A}{(j\omega)^\alpha}$ |

In Table I, A, D, $\delta, \sigma, \omega$ and a are parameters which affect the behavior of the element.

Figure 7A:
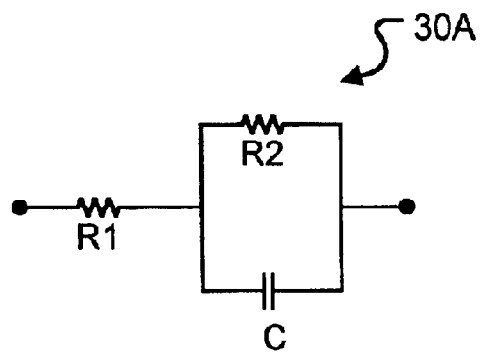
FIGS. 7A, 7B and 7C are examples of electronic circuits, which may be used to model electrochemical batteries.
Figure 7B:
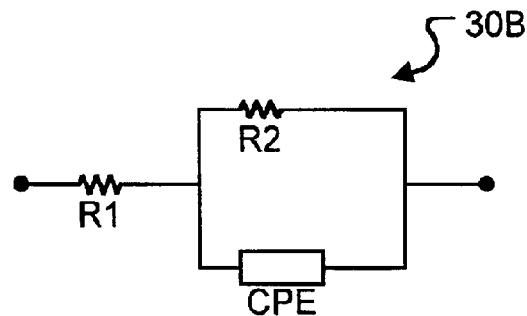
Figure 7C:
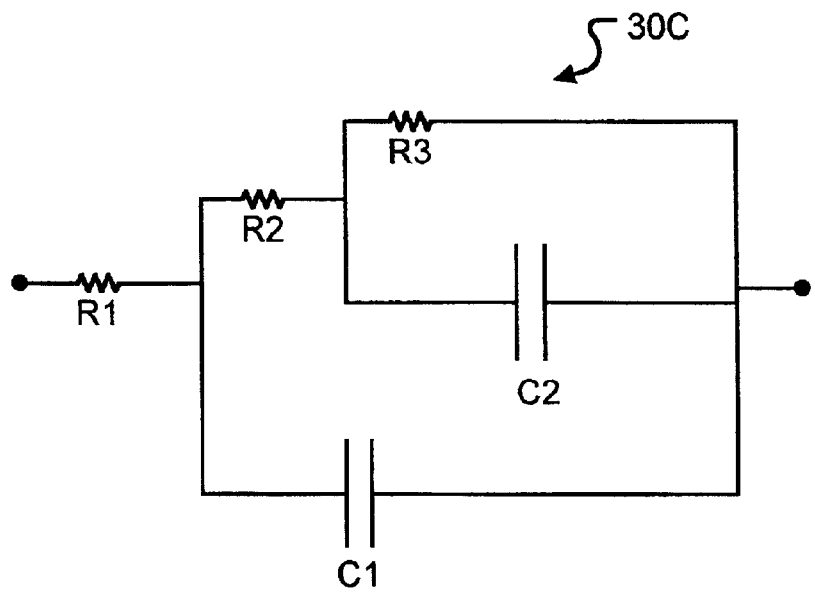

FIGS. 7A, 7B and 7C illustrate example equivalent electronic circuits 30A, 30B and 30C, which may be used as the equivalent electronic circuit models for the behavior of a battery. Circuit 30A of FIG. 7A is known as Randle's model. Each model has a number of variable parameters that correspond with the circuit components. For example, Randle's model 30A includes the parameters $R_1$, $R_2$ and C.

Figure 7D:
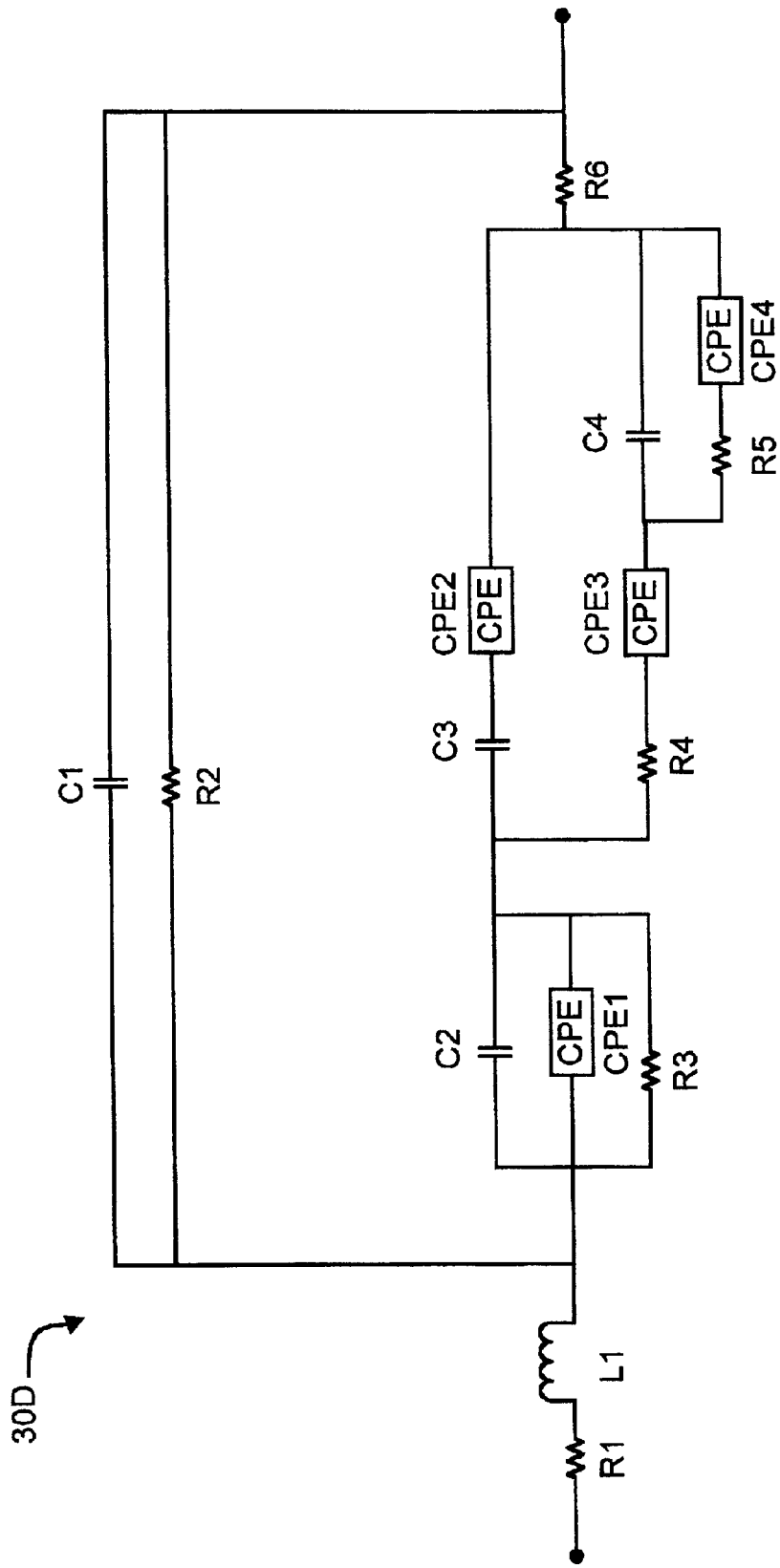
FIG. 7D is an example of an electronic circuit which may be used to provide several different models of electrochemical batteries.

A single equivalent electronic circuit may include one or more configuration parameters, which can be set in such a manner that the single equivalent electronic circuit may be used to generate several different equivalent electronic circuit models by selecting different values for the configuration parameters. For example, the circuit 30D of FIG. 7D may be used to generate different models by selectively fixing the values of configuration parameters associated with certain components. For example, if L1 is configured to have a value of 0 H, and R6 is configured to have an infinite value, then circuit 30D of FIG. 7D is the same as Randle's model 30A of FIG. 7A. Other models may be created by setting the values of other configuration parameters.

Block 160 involves an identification of a particular model from a library, which may be stored in memory 26. The library may comprise a number of models which may be equivalent electronic circuit models. Each model may comprise a software routine, which produces as output the real and imaginary components of the model's impedance Z as a function of frequency and the parameters of the model. For example, the complex impedance Z of the Randle's model circuit 30A as a function of the angular frequency $\omega$ and the parameters $R_1$, $R_2$ and C is given by:

$$Z = R_1 + \frac{R_2 - j\omega C R_2^2}{1 + \omega^2 C^2 R_2^2} \qquad (4)$$

The library may also contain functions that produce as outputs the partial derivatives of the real and imaginary components of the complex impedance Z with respect to each parameter. For example, the partial derivative of the real part of equation (4) with respect to $R_1$ is 1. The partial derivative of the imaginary part of equation (4) with respect to $R_1$ is 0. The partial derivative of the real part of equation (4) with respect to $R_2$ is given by:

$$\frac{\partial \text{Re}(Z)}{\partial R_2} = \frac{1 - \omega^2 C^2 R_2^2}{(1 + \omega^2 C^2 R_2^2)^2} \qquad (5)$$

The partial derivative of the imaginary part of equation (4) with respect to $R_2$ is given by:

$$\frac{\partial \text{Im}(Z)}{\partial R_2} = -2\frac{\omega R_2}{(1 + \omega^2 C^2 R_2^2)^2} \qquad (6)$$

The partial derivative of the real part of equation (4) with respect to C is given by:

$$\frac{\partial \text{Re}(Z)}{\partial C} = -2\frac{\omega^2 C R_2^3}{(1 + \omega^2 C^2 R_2^2)^2} \qquad (7)$$

The partial derivative of the imaginary part of equation (4) with respect to C is given by:

$$\frac{\partial \text{Im}(Z)}{\partial C} = \frac{\omega^3 C^2 R_2^4 - \omega R_2^2}{(1 + \omega^2 C^2 R_2^2)^2} \qquad (8)$$

Equations (4) through (8) relate to the Randle's model circuit 30A of FIG. 7A. Similar impedance models and partial derivatives for the circuits 30B, 30C and 30D of FIGS. 7B, 7C and 7D may be calculated using standard electrical engineering circuit analysis techniques.

In block 162, the parameters of the current model are adjusted to fit the extracted impedance data for the N excitation frequencies acquired in loop 123. This fitting process may be accomplished using any of a wide range of known data fitting routines. Any suitable data fitting routine may be used. For example, a non-linear least squares data fitting routine may be used. Suitable data fitting methods are described in many texts on the topic of numerical methods including Recktenwald *Numerical Methods with MATLAB: Implementations and Applications* Prentice Hall, 2000 ISBN: 0201308606; Dennis and Schnabel, *Numerical Methods for Unconstrained Optimization and Nonlinear Equations* SIAM, 1996;Gould and Tobochnik, *An Introduction to Computer Simulation Methods—Applications to Physical Systems* (2nd edition); and Press et al. *Numerical Recipes— The Art of Scientific Computing*.

Fitting the data may comprise starting with an initial set of parameter values and using the model to predict real and imaginary components of the model's complex impedance at each of the N excitation frequencies. The imaginary components of the impedance data and the real components of the impedance data may be fitted separately to the model. For each of the real and imaginary components, a difference vector F may be prepared. Each difference vector F comprises an N-element vector. The N data elements of the real difference vector F are the difference between:

the real component of the impedance data at one of the N excitation frequencies (i.e. as determined in block 134); and, the real component of the impedance predicted by the model at that frequency.

Similarly, the N data elements of the imaginary difference vector F are the difference between:

the imaginary component of the extracted impedance at one of the N excitation frequencies (i.e. as determined in block 134); and the imaginary component of the impedance predicted by the model at that frequency.

For both the real and imaginary cases F is a function of the parameters of the model.

For each of the real and imaginary difference vectors F, a data fitting routine, such as a least squares data fitting routine, seeks to minimize the value $f$ which is given by:

$$f = \frac{1}{2} F^T F \qquad (9)$$

where $F^T$ is the transpose of the difference vector F. Because F is a function of the parameters of the model. In this example, $f$ is a function of the parameters of Randle's model 30A of FIG. 7A, (i.e. the parameters $R_1$, $R_2$ and C). A set of parameter values which minimizes $f$ may be obtained using Newton's method.

Newton's method begins with an initial set of values for the parameters to be determined and progressively refines those values to approach the desired solution. In one embodiment of the invention a set of parameters P which more closely minimizes $f$ may be obtained from the following matrix relationship:

$$\nabla F \nabla F^T P = -\nabla F F \qquad (10)$$

where $\nabla F$ is a gradient matrix (or "Jacobian" matrix). For the example of Randle's model 30A, the gradient matrix can be as follows:

$$\nabla F = \begin{matrix} \frac{\partial F(\omega_1)}{\partial R_1} & \frac{\partial F(\omega_2)}{\partial R_1} & \cdots & \frac{\partial F(\omega_N)}{\partial R_1} \\ \frac{\partial F(\omega_1)}{\partial R_2} & \frac{\partial F(\omega_2)}{\partial R_2} & \cdots & \frac{\partial F(\omega_N)}{\partial R_2} \\ \frac{\partial F(\omega_1)}{\partial C} & \frac{\partial F(\omega_2)}{\partial C} & \cdots & \frac{\partial F(\omega_N)}{\partial C} \end{matrix} \qquad (11)$$

Each row of $\nabla F$ has N elements corresponding to the N excitation frequencies and each element of $\nabla F$ represents a partial derivative of F with respect to one of the model parameters.

Equation (10) represents a set of linear equations, which may be solved by any suitable method including Gaussian elimination. The process can be repeated until $f$ has a suitably low value. The process may be repeated until $f$ is lower than a threshold or until a threshold number of iterations has been completed. For example the process may be terminated if 100 iterations have been completed even if $f$ has not been reduced to below the threshold. If the process terminates without reducing $f$ to a satisfactory level then block 162 may be repeated one or more times with different sets of initial parameter values.

Block 164 checks the fit of the model to the extracted impedance data at the N excitation frequencies (as determined in block 134). If the fit is not good enough (as determined in block 166), then the impedance data from some of the N excitation frequencies may be eliminated in block 168 and block 162 may be repeated with a reduced set of data to be fitted.

In block 164, the process of checking the fit of the model to the extracted impedance data for the N excitation frequencies may involve the computation of a statistic, which can be used to detect autocorrelation of the residuals (i.e. the autocorrelation of the data elements of the difference vector F). For example a Durban-Watson statistic (d) may be computed according to the following equation:

$$d = \frac{\sum_{i=1}^{i=n-1} (F_{i+1} - F_i)^2}{\sum_{i=1}^{n} F_i^2} \qquad (12)$$

d has a value of close to 2 if the residuals are randomly distributed and has a small value if there is a positive serial correlation in the data elements $F_i$ of the difference vector F. If d is lower than a threshold, then block 162 may be repeated with a new initial set of parameter values or block 162 may be repeated with a reduced set of data or the model may be rejected.

Loop 161 iterates until a plurality of models have been fitted to the impedance data acquired in block 134. When there are no more models to process, loop 161 is exited in block 172 and processing is transferred to an inference routine as indicated by block 174.

The inference routine derives a value for a characteristic of battery 20 based on parameters from the plurality of fitted models.

The characteristic of interest may be selected based upon user input, such as the setting of a control. Alternatively, the characteristic to be tested may be pre-configured. The characteristic of interest may be one or more of: SoC, SoH, cold cranking amperes (CCA), cranking amperes (CA), marine cranking amperes (MCA), reserve capacity, and capacity. The characteristic of interest could also be an indicator of a specific battery failure mode. For example, a certain type of battery may be prone to failure by a mechanism involving the degradation of one electrode. With such a battery, the invention may be used to determine a value of a battery characteristic that indicates the degree of electrode degradation.

In general, the inference routine receives the sets of parameters that have been obtained by fitting each of a plurality of models (i.e. one set of parameters for each fitted model). Depending upon the battery characteristic of interest, the inference routine may use a selected set of parameters from each of the plurality of models. For example, when the characteristic being tested is SoH, and the model is Randle's model 30A (see FIG. 7A), then a particular embodiment of the invention may use the parameter $R_1$ in determining SoH. $R_2$ and C may not be used by the inference routine to determine SoH. The inference routine may also base its determination of a characteristic on mathematical combinations of parameters of a given model.

FIG. 5C illustrates an inference portion of method 120 according to one embodiment of the invention that begins at point B. In block 180, method 120 selects the parameters (or combinations of parameters) to be used in the determination of one or more battery characteristics of interest.

In block 184, each of the parameters is normalized. In this example embodiment of the invention, normalization comprises using the parameter as an input to a plurality of normalization functions. FIG. 8 illustrates a possible set of normalization functions 40A through 40D (collectively, normalization functions 40). Each group of normalization functions 40 is used to normalize (and is therefore associated with) a particular parameter or combination of parameters. For example, normalization functions 40 may be used to normalize the parameter $R_1$ of Randle's model 30A for use in the determination of SoH for a particular type of battery 20. It is convenient for normalization functions 40 to be triangular functions as shown in FIG. 8. This is not necessary. Other functions could also be used as normalization functions. The number of normalization functions may vary and need not be the same for every parameter.

Each of the individual normalization functions (40A, 40B, 40C and 40D) corresponds to a particular value of the characteristic of interest. The particular characteristic values with which the normalization functions are associated are preferably equally spaced apart. For example, where the battery characteristic of interest is SoH, the individual normalization functions (40A, 40B, 40C and 40D) may correspond to particular SoH values of 100%, 83%, 67% and 50%; or 100%, 90%, 80% and 70%. The individual normalization functions (40A, 40B, 40C and 40D) are chosen so that their maxima occur at typical parameter values ($X_1$, $X_2$, $X_3$ and $X_4$) of the parameter being normalized. The typical parameter values ($X_1$, $X_2$, $X_3$ and $X_4$) represent the most likely parameter values for a battery having a particular value of the corresponding battery characteristic.

The normalization functions 40 depicted in FIG. 8 represent an illustrative example, where the characteristic is the SoH of a particular battery type and the parameter being normalized is $R_1$ of Randle's model 30A. Normalization function 40A is associated with the characteristic value of SoH=100%. For this particular battery type, a most probable value of $R_1$ (when SoH is 100%) is $R_1=X_1$ Ω. Consequently, normalization function 40A has its maximum at the parameter value $R_1=X_1$ Ω. Similarly, normalization function 40B (associated with a SoH of 83%) has its maximum at the parameter value $R_1=X_2$ Ω, because $R_1$ has a most probable value of $X_2$ Ω, when the SoH is 83%. For a SoH of 67%, the parameter $R_1$ has a most probable value of $R_1=X_3$ Ω and for a SoH of 50% the parameter $R_1$ has a most probable value of $R_1=X_4$ Ω.

The normalization functions may be preset functions corresponding to a particular type of battery to be tested or may be generated from information about the characteristics of the battery to be tested. As an example of the latter approach, the normalization functions may be obtained by scaling a prototype set of normalization functions relative to information about the battery being tested. The information may comprise a capacity of the battery.

The outputs from the normalization functions (all in the range of 0 to 1, for example) may be stored in a matrix in which each column of the matrix is associated with a particular value of a characteristic and each row represents the output of a set of normalization functions for different parameters (or combinations of parameters). FIG. 9 shows an example 42 of such a matrix in a case where there are normalization functions corresponding to four values of a characteristic for each parameter.

In block 186, the results of normalization block 184 are aggregated to yield a value for the characteristic being tested. Aggregation may be performed by taking the weighted average of the elements of matrix 42. A weighted average may be performed by performing the following calculation:

$$\text{Value} = \frac{\sum_{i=1}^{n} R_i B_i}{\sum_{i=1}^{n} B_i} \tag{13}$$

where the index i runs over the columns of matrix 42, $R_i$ is the characteristic value corresponding to the $i^{th}$ column of matrix 42 and $B_i$ is the sum of the values in the $i^{th}$ column of matrix 42. This weighted average can be visualized as finding the balancing point of the line illustrated in FIG. 10. The numbers in FIG. 10 correspond to the elements of matrix 42 of FIG. 9. For the numbers of FIG. 9, the value of the battery characteristic determined according to equation (13) is:

$$\frac{100\% \times (.8 + .7 + .6) + 83\% \times (.6)}{(.8 + .7 + .6 + .6)} = 96.2\% \tag{14}$$

In block 188, the value of the characteristic determined in aggregation block 186 is presented to a user by way of display 28 and/or stored for future reference.

Different procedures could be used for determining a value of the battery characteristic based upon parameters of a plurality of models. For example:

The contribution of each model to the computation of the characteristic value could be weighted according to one or more of: a metric relating to how well the model fits the data from the battery or other system under test, and a measure of correlation (such as a Durban-Watson statistic) in the results obtained for that model.

Fuzzy logic methods may be used to obtain the characteristic value.

The characteristic value may be obtained by identifying a set of one or more best-fitting models from among the plurality of models and basing the characteristic value upon parameters of the set of best-fitting models.

The characteristic value could be computed separately for each model as a model-predicted value and the model-predicted values combined using an average, which could be a weighted average.

Some models could be weighed more heavily than others in determining a characteristic value.

Other comparative and/or normalization techniques could be employed in determining the characteristic value.

Apparatus 10 may provide a user with additional information. For example, some embodiments of apparatus 10 may provide as output the parameters for one or more models.

As will be apparent to those skilled in the art in the light of the foregoing disclosure, many alterations and modifications are possible in the practice of this invention without departing from the spirit or scope thereof. For example:

In the apparatus of FIG. 2, current could be sensed by an inductive pick up 18A instead of by measuring a voltage across a current shunt 18;

In the apparatus of FIG. 2, separate ADCs could be provided for measuring voltage and current;

Data collection and data analysis could be performed in separate apparatus or in separate processors within an apparatus;

Instead of obtaining data separately for different excitation frequencies, data could be obtained simultaneously for multiple excitation frequencies. This could be done by exciting battery 20 with a waveform which is not monochromatic. For example, excitation signal 13 could combine two or more frequency components. Excitation signal 13 could comprise a square wave or a triangular wave.

In foregoing description, excitation signal 13 has been described as a sinusoidal waveform, which is balanced in that it charges battery 20 for one half cycle and then discharges battery 20 for one half cycle. The net result is that battery 20 is neither charged significantly nor discharged significantly during testing. The methods of the invention could also be performed by exciting battery 20 with a waveform which only discharges battery 20.

The invention could be practised by using existing electrical noise as the exciting waveform.

All methods and calculations relating to the complex impedance Z of battery 20 or of the equivalent electronic circuit models could be performed with respect to the complex admittance $Y=Z^{-1}$.

All methods and calculations relating to complex quantities (i.e. having real and imaginary components) could also be performed in the mathematically equivalent representation of phase and amplitude.

The invention may be applied to testing electrochemical systems other than electrochemical batteries. For example, the invention may be applied to testing fuel cells or testing the integrity of coatings which have been applied to metallic substrates.

Certain implementations of the invention comprise computer processors which execute software instructions which cause the processors to perform a method of the invention. For example, the invention may also be provided in the form of a program product. The program product may comprise any medium which carries a set of computer-readable signals comprising instructions which, when executed by a computer processor, cause the data processor to execute a method of the invention. The program product may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Accordingly, the scope of the invention is to be construed in accordance with the substance defined by the following claims.

What is claimed is:

1. A method for testing an electrochemical system, the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters.

2. The method of claim 1, wherein the electrochemical system comprises a battery.

3. The method of claim 2, wherein deriving the value of the characteristic comprise; performing a fuzzy logic inference method.

4. The method of claim 2, wherein deriving the value of the characteristic comprises:

for each of two or more of the plurality of models, computing an autocorrelation of differences between the complex impedance data and impedances predicted by the model using the fitted parameters; and, weighing a contribution of one or more models to the value of the characteristic according to the autocorrelation of differences for each of the two or more models.

5. The method of claim 2, wherein deriving the value of the characteristic comprises:

for each two or more of the plurality of models, computing a metric of a degree to which the model fits the complex impedance data; and, weighing a contribution of one or more of the two or more models to the value of the characteristic according to the metric; computed for the two or more models.

6. The method of claim 2, wherein obtaining complex impedance data comprises applying an excitation signal to the electrochemical system and measuring a response of the electrochemical system to the excitation signal.

7. The method of claim 2 wherein the excitation signal comprises a sine wave and obtaining complex impedance data comprises varying a frequency of the sine wave to each of a plurality of excitation frequencies and, for each of the plurality of excitation frequencies, sampling a voltage waveform and a current waveform.

8. The method of claim 1, wherein deriving the value for the characteristic comprises:

selecting the one or more parameters from the set of fitted parameters; and, for each of the one or more parameters, determining an output of a plurality of normalization functions.

9. The method of claim 8, wherein deriving the value for the characteristic comprises computing a weighted average of the outputs of the normalization functions.

10. The method of claim 9, wherein each of the normalization functions corresponds to a notional value for the characteristic and comprises the weighted average comprises weighting the corresponding notional values by the outputs of the normalization functions.

11. The method of claim 1, wherein the electrochemical system comprises a fuel cell.

12. A method according to claim 1, wherein the characteristic of the electrochemical system is one of: state of health (SoH), state of charge (SoC), cold cranking amperes (CCA), cranking amperes (CA), marine cranking amperes (MCA), reserve capacity and capacity.

13. A method for testing an electrochemical system, the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters selected from the set of one or more fitted parameters;

wherein the electrochemical system comprises a battery and fitting the complex impedance data to the plurality of models comprises, for each of the plurality of models, performing a least-squares fitting routine.

14. The method of claim 13, wherein the plurality of frequencies comprises a number N of frequencies and N is larger than a number of fitted parameters of any of the models.

15. The method of claim 14, wherein the least-squares fitting routine comprises a non-linear least-squares fitting routine.

16. A method for testing an electrochemical system, the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters;

wherein the electrochemical system comprises a battery and fitting the complex impedance data to a plurality of models comprises, for at least one of the plurality of models;

commencing with an initial set of parameter values;

performing a number of iterations of a least-squares fitting routine; and, if after the number of iterations of the least-squares fitting routine the model fails to fit the impedance data, commencing with another set of parameter values different from the initial set of parameter value, and performing more iterations of the least-squares fitting routine.

17. A method for testing an electrochemical system, the method comprising:

obtaining complex impedance data for the electrochemical system at a plurality of frequencies;

fitting the complex impedance data to a plurality of models of the electrochemical system to obtain a set of fitted parameter, the set of fitted parameters comprising at least one fitted parameter corresponding to each of the models; and, deriving a value for a characteristic of the electrochemical system based upon one or more parameters selected from the set of one or more fitted parameters;

wherein the electrochemical system comprises a battery and fitting the complex impedance data to a plurality of models comprises, for at least one of the plurality of models:

determining values for a plurality of fitted parameters;

computing a correlation of differences between the complex impedance data and impedances predicted by the model using the fitted parameters; and, rejecting the model if the correlation exceeds a threshold.

18. The method of claim 17, wherein computing the autocorrelation comprises computing a Durban-Watson statistic.

19. A method for testing an electrochemical system; the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and deriving a value for a characteristic of the electrochemical system based upon one or more parameters selected from the set of one or more fitted parameters;

wherein the electrochemical system comprises a battery and fitting the complex impedance data to a plurality of models comprises, for at least one of the plurality of models:

performing a number of iterations of a least-squares fitting routine; and, if after the number of iterations of the least-squares fitting routine the model fails to fit the complex impedance data, eliminating data associated with one or more frequencies from the complex impedance data and repeating the least-squares fitting routine.

20. A method for testing an electrochemical system, the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters;

wherein the electrochemical system comprises a battery and fitting the complex impedance data to a plurality of models comprises, for at least one of the plurality of models:

determining values for a plurality of fitted parameters;

computing a correlation of differences between the complex impedance data and impedances predicted by the model using the fitted parameters; and, if the correlation exceeds a threshold, eliminating data associated with one or more frequencies from the complex impedance data and repeating determining the values for the plurality of fitted parameters.

21. A method for testing an electrochemical system, the method comprising:

obtaining complex impedance data for the electrochemical system at a plurality of frequencies;

fitting the complex impedance data to a plurality of models of the electrochemical system to obtain a set of fitted parameters, the set of fitted parameters comprising at least one fitted parameter corresponding to each of the models; and, deriving a value for a characteristic of the electrochemical system based upon one or more parameters selected from the set of one or more fitted parameters, wherein deriving the value for the characteristic comprises:
    selecting the one or more parameters from the set of fitted parameters; and
    for each of the one or more parameters, determining an output of a plurality of normalization functions, wherein the one or more parameters from the set of fitted parameters comprises fewer than all of the fitted parameters.

22. The method of claim 21, wherein the normalization functions comprise triangular functions.

23. A method for testing an electrochemical system, the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and,
    deriving a value for a characteristic of the electrochemical system based upon one ore more parameters selected from the set of one or more fitted parameters;
wherein deriving the value for the characteristic comprises: for each of two or more of tile models, computing a model-predicted value for the characteristic based upon one or more of the fitted parameters of the model; and, averaging two or more of the model-predicted values for the characteristic.

24. A method of claim 23, wherein averaging the two or more model-predicted values for the characteristic comprises computing a weighted average of the plurality of the model-predicted values for the characteristic.

25. A method for testing an electrochemical system, the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and,
    deriving a value for a characteristic of the electrochemical system based upon one or more parameters selected from the set of one or more fitted parameters,
wherein the electrochemical system comprises a battery and deriving the value of the characteristic comprises, identifying a set of one or more best-fitting models from among the plurality of models and basing the value for the characteristic upon fitted parameters associated with the set of best-fitting models.

26. A method for testing an electrochemical system, the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and,
    deriving a value for a characteristic of the electrochemical system based upon one ore more parameters selected from the set of one or more fitted parameters, wherein the electrochemical system comprises a battery, wherein obtaining complex impedance data comprises applying an excitation signal to the electrochemical system and measuring a response of the electrochemical system to the excitation signal, wherein obtaining complex impedance data comprises performing a Fourier transform of the sampled voltage and current waveforms.

27. The method of claim 26, comprising applying a windowing function to the sampled voltage and current waveforms prior to performing the Fourier transform.

28. The method of claim 27, wherein the windowing function is selected from the Hanning window function, the Hamming window function and the Kaiser window function.

29. A method for testing an electrochemical system; the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and
    deriving a value for a characteristic of the electrochemical system based upon one or more parameters selected from the set of one or more fitted parameters;
wherein the electrochemical system comprises a battery and obtaining the complex impedance data comprises setting a level of the excitation signal to a level lower than a threshold level.

30. The method of claim 29, wherein setting a level of the excitation signal to a level lower than a threshold level comprises controlling a gain, of an amplifier.

31. The method of claim 30, wherein controlling the gain of the amplifier comprises performing a PID loop.

32. A method for testing an electrochemical system; the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and
    deriving a value for a characteristic of the electrochemical system based upon one or more parameters selected from the set of one or more fitted parameters;
    wherein the electrochemical system comprises a battery and the plurality of excitation frequencies comprises 5 or more frequencies.

33. The method of claim 32, wherein the plurality of excitation frequencies comprises 65 or fewer frequencies.

34. A method for testing an electrochemical system; the method comprising:
    obtaining complex impedance data for the electrochemical system at a plurality of frequencies;
    fitting the complex impedance data to a plurality of models of the electrochemical system to obtain a set of fitted parameters, the set of fitted parameters comprising at least one fitted parameter corresponding to each of the models; and
    deriving a value for a characteristic of the electrochemical system based upon one or more parameters selected from the set of one or more fitted parameters;

wherein the electrochemical system comprises a battery and each of the plurality of excitation frequencies has a frequency of at least 10 Hz.

35. The method of claim 34, wherein each of the plurality of excitation frequencies is in the range of 10 Hz to 10 KHz.

36. The method of claim 34 wherein each of the plurality of excitation frequencies is in the range of 10 Hz to 2500 Hz.

37. A method for testing an electrochemical system, the method comprising:
   obtaining complex impedance data for the electrochemical system at a plurality of frequencies;
   fitting the complex impedance data to a plurality of models of the electrochemical system to obtain a set of fitted parameters, the set of fitted parameters comprising at least one fitted parameter corresponding to each of the models; and,
   deriving a value for a characteristic of the electrochemical system based upon one ore more parameters selected from the set of one or more fitted parameters;
wherein the electrochemical system comprises a layer of a coating on a surface.

38. A method for deriving a characteristic of an electrochemical system comprising:
   extracting impedance data from the electrochemical system at a plurality of discrete frequencies;
   mathematically fitting a plurality of models to the extracted impedance data to obtain a set of fitted parameters;
   inferring the characteristic based on one or more parameters selected from the set of fitted parameters.

39. Apparatus for testing an electrochemical system, the apparatus comprising:
   a measuring circuit connectable to measure responses of the electrochemical system to an excitation signal at a plurality of frequencies;
   a data processor configured to:
      obtain complex impedance data for the electrochemical system from the measuring circuit;
      fit the complex impedance data to a plurality of models of the electrochemical system to obtain a set of fitted parameters the set outfitted parameters comprising at least one fitted parameter corresponding to each of the models; and,
      derive a value for a characteristic of the electrochemical system based upon one or more parameters of the set of fitted parameters.

40. An apparatus according to claim 39, wherein the measuring circuit comprises a analog to digital converter, which is connected to digitally sample at least one of a voltage signal and a current signal, from one or more test points in the measuring circuit.

41. The apparatus of claim 39 wherein the data processor comprises a processor executing software instructions, wherein the software instructions cause the data processor to implement a digital filter and to obtain the complex impedance data from an output of the digital filter.

42. Apparatus for testing an electrochemical system, the apparatus comprising:
   a measuring circuit connectable to measure responses of the electrochemical system to an excitation signal at a plurality of frequencies;
   a data processor configured to:
      obtain complex impedance data for the electrochemical system from the measuring circuit;
      fit the complex impedance data to a plurality of models of the electrochemical system to obtaining a set of fitted parameters, the set of fitted parameters comprising at least one fitted parameter corresponding to each of the models; and,
      derive a value for a characteristic of the electrochemical system based upon one or more parameters of the set of fitted parameters, wherein the data processor comprises a processor executing software instructions the software instructions cause the data processor to implement a digital filter and to obtain the complex impedance data from an output of the digital filter, and the software instructions cause the data processor to:
   implement a set of normalization functions which receive as input the at least one fitted parameter corresponding to each of the models; and,
   derive the value for the characteristic based upon outputs of the normalization functions.

43. An apparatus according to claim 39, comprising a display configured to output the characteristic to a user.

44. An apparatus for testing an electrochemical system comprising:
   means for extracting impedance data from the electrochemical system at a plurality of discrete frequencies;
   means for mathematically fitting a plurality of models to the extracted impedance data to obtain a set of fitted parameters;
   means for inferring a characteristic of the electrochemical system based on one or more parameters selected from the set of fitted parameters.

45. A machine readable medium carrying data, which data comprises a set of instructions which, when executed by a data processor, cause the data processor to perform a method of testing an electrochemical system, the method comprising:
   obtaining impedance data for the electrochemical system at a plurality of frequencies;
   fitting the impedance data to a plurality of models of the electrochemical system to obtain a set of fitted parameters, the set of fitted parameters comprising at least one fitted parameter corresponding to each of the models; and,
   deriving a value for a characteristic of the electrochemical system based upon one or more parameters selected from the set fitted parameters.

* * * * *